Aug. 21, 1962 D. D. WILLARD 3,050,692
AUTOMATIC GAIN CONTROL
Original Filed Dec. 26, 1957
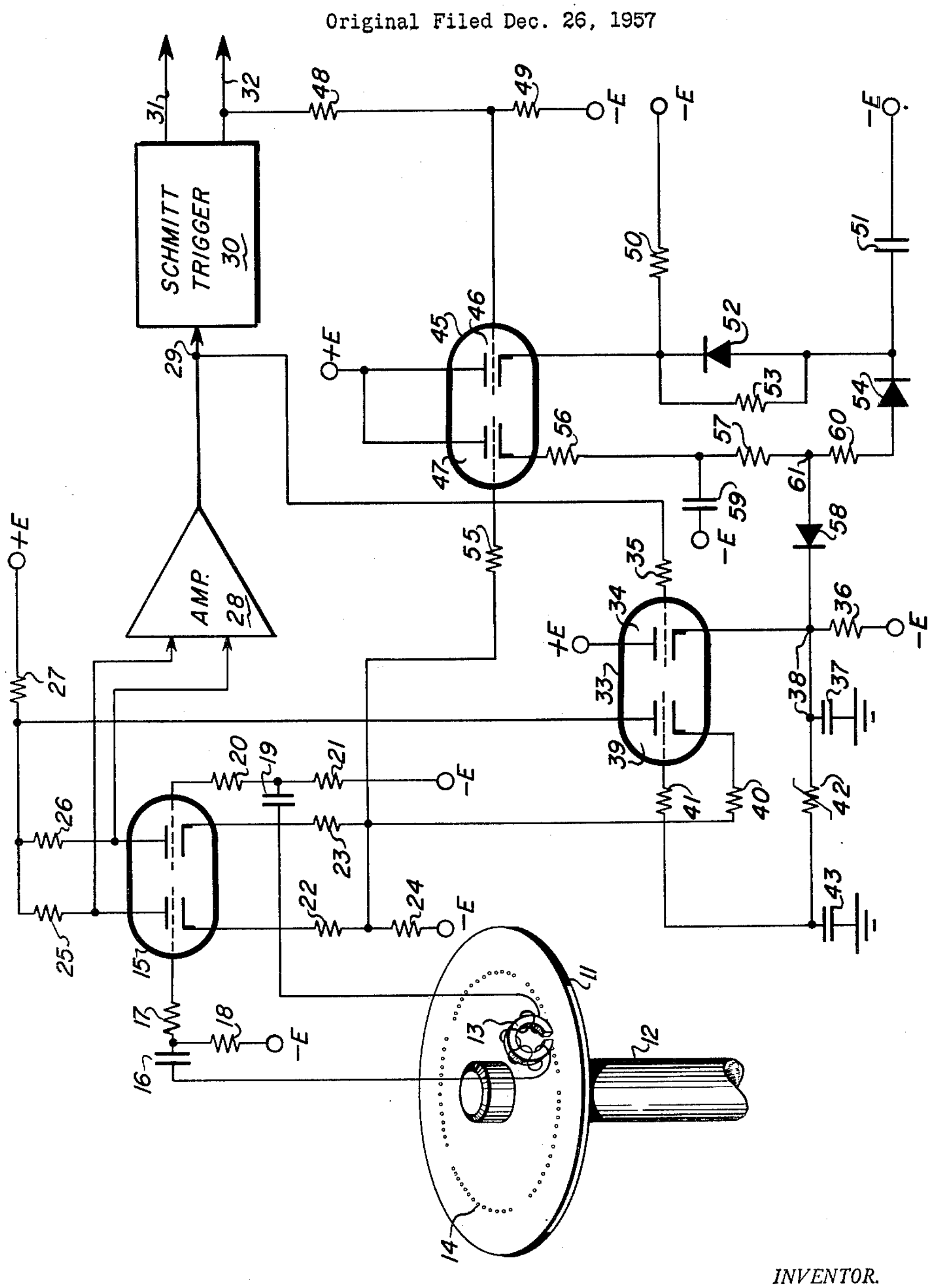
INVENTOR.
DENNIS D. WILLARD
BY
Edward A. Robinson
ATTORNEY United States Patent Office 3,050,692
Patented Aug. 21, 1962

3,050,692
AUTOMATIC GAIN CONTROL

Dennis D. Willard, San Jose, Calif., assignor to International Business Machines Corporation, New York, N.Y., a corporation of New York
Continuation of application Ser. No. 705,426, Dec. 26, 1957. This application Nov. 14, 1960, Ser. No. 69,222
7 Claims. (Cl. 330—133)

This invention relates to apparatus for maintaining output signals from an amplifier at a constant level, and more particularly to such circuits wherein the signal being amplified is intermittent in nature having time intervals during which no signal is present.

This application is a continuation of my copending application, Serial Number 705,426 filed December 26, 1957, now abandoned.

In data processing machines, storage devices are employed for receiving and retaining informational data for future use. Such storage devices may be in the form of a continuously moving or rotating magnetic surface which may receive the data from a transducer in the form of positive and negative "bits" identifiable by the magnetic polarity thereof. If the storage device comprises a magnetic surface on a disc or a drum, any of a series of closed paths or tracks may be selected by a transducer which may move to a selected position adjacent thereto. Each of the magnetic tracks may be further divided into sectors having gaps therebetween.

When information is "read" from such a storage device, the signal may comprise a series of voltage pulses indicative of the bits as each sector is scanned by the transducer; and an interval of no signal occurs when the transducer encounters a gap between sectors. It is desirable that the output signal levels be maintained substantially constant, and therefore a "read" amplifying circuit utilizes an automatic gain control having a negative feedback loop. With such a feedback loop, output signals are sampled, the amplifier gain is reduced when such signals are too great, and the gain is increased when the signals become too weak. Such an automatic gain control circuit has been found satisfactory when the amplified signal is substantially continuous and uninterrupted. However, when a magnetic transducer encounters a gap upon the magnetic surface, a resulting interval of no signal may cause the automatic gain control circuit to bias the amplifier into a maximum gain condition. Thereafter, signals generated from the next sector of the recording track will be unduly amplified and thereby distorted.

It is an object of this invention to provide an automatic gain control circuit which is capable of maintaining the output signals from an amplifier at a substantially constant level and is further capable of clamping the amplifier at a fixed gain when there are no output signals present.

It is a further object of this invention to provide an amplifier with an automatic gain control circuit having a relatively short time constant when signals are present to be amplified, and having a relatively long time constant when there are no signals present.

Another object of this invention is to provide an amplifying circuit with an automatic gain control employing a negative feedback loop and to further provide a clamping means which is responsive to the output signals of the amplifier and which is operative to disable the automatic gain control during intervals when there are no output signals present.

Briefly stated, according to this invention a magnetic storage device is coupled to an amplifier, and an automatic gain control circuit provides a negative feedback path. A cathode follower tube is coupled to the output signal of the amplifier and generates a voltage at its cathode corresponding to the level of the output signals.

A clamp circuit is coupled to sense the output signals of the amplifier and is further coupled to the cathode of the cathode follower tube. When the clamp circuit senses the presence of output signals, a diode remains nonconductive and does not effect the cathode voltage of the cathode follower tube. However, when output signals are not present for a predetermined amount of time, the diode clamps the cathode voltage and effectively disables the operation of the cathode follower such that the amplifier gain is maintained constant.

Other objects of the invention will be pointed out in the following description and claims and illustrated in the accompanying drawing which discloses, by way of example, the principle of the invention and the best mode which has been contemplated of applying that principle.

The drawing is a circuit diagram of a read amplifier associated with a magnetic storage device and including an AGC feedback circuit and a clamp circuit according to the teaching of this invention.

As shown by the drawing, the data storage device may include a disc 11 rotatable with a shaft 12 and having a magnetic coating or surface thereon. A transducer 13 may be positioned adjacent to the magnetic surface to scan a circular track 14 as the disc 11 rotates. In actual practice, the data storage device may include several discs 11 having magnetic surfaces on each side thereof and several transducers, each supported by an access arm and movable to any selected one of many concentric tracks on a selected disc surface.

The transducer 13, as shown in the drawing, may include a magnetic core with a recording gap as shown or with a vertical pole and with a winding linking therewith. A transducer 13 is shown coupled directly to a push-pull amplifier stage including a double triode 15, although in actual practice further circuitry including a preamplifier and possible switching elements may be inserted between the transducer 13 and the push-pull amplifier 15. The coupling elements illustrated include a condenser 16, a resistor 17 and a grid leak resistor 18 which couple the transducer 13 to the grid of one of the triodes, and a condenser 19, a resistor 20 and a grid leak resistor 21 which couple the other side of the transducer to the grid of the second triode. Further circuit elements associated with the triodes 15 include the separate cathode resistors 22 and 23 which are both connected to a common cathode resistor 24, which is in turn connected to a negative reference potential —E. The plate circuits of the triode have individual load resistors 25 and 26 which are connected together and to a common load resistor 27 which in turn is connected to a positive reference potential +E. In actual practice, the amplifier would include further stages of amplification which may be similar to that shown associated with the double triode 15, but for simplicity these further stages are indicated schematically as box 28. As a final stage, the amplifier 28 may include a clipping circuit such that the output signal appearing at a point 29 will be of uniform amplitude. A monostable or single shot multivibrator circuit 30 will be triggered from the amplified signals and will thereby produce an output pulse of standard amplitude and duration. As shown in the drawing, the multivibrator may have two output circuits, each of which being connected to the plate circuit of one of the triodes constituting the multivibrator. It may therefore be appreciated that the final output from the read amplifier and multivibrator circuits 28—30 will be a series of positive pulses on a first of the output connections 31 and a corresponding series of negative pulses appearing at the second output connection 32. The read output signal may therefore be selected as positive or negative going pulses to be compatible with further circuitry of a data processing machine.

The automatic gain control, AGC, is a negative feedback circuit including two triodes which may be within a single evacuated envelope 33. A first of the triodes 34 is connected as a cathode follower responsive to output signals from the amplifier 28. Thus, the anode or plate of the triode 34 is directly connected to a positive reference potential +E and the grid is coupled to the point 29 at the output of the amplifier 28 by a resistor 35. The cathode of the triode 34 is coupled to a negative reference potential −E through a load resistor 36. An integrating condenser 37 connected between the cathode of the triode 34 and a ground reference potential serves to develop a voltage at a point 38 which is representative of the output signals from the amplifier appearing at the point 29.

A second triode 39 within the envelope 33 constitutes a control tube for the AGC circuit. The control triode 39 is connected to provide a parallel path for the direct current flow with the amplifier tube 15. Thus, the anode of the triode 39 is connected to a positive reference potential through the same common load resistor 27 which is shared by the triodes of the push-pull amplifier 15, and the cathode of the triode 39 is coupled by a separate resistor 40 to the common cathode resistor 24 which is shared with the push-pull amplifier 15. It may be appreciated that the current flow through the two triodes of the amplifier tube 15 and the control triode 39 is limited by the values of the positive and negative reference potentials +E and −E and by the resistances 24 and 27. Therefore, if the control triode 39 were to conduct heavily, the voltage drops across the resistors 24 and 27 would increase substantially and the two triodes of the push-pull amplifier 15 would be biased into lesser conduction. Conversely, if the control triode 39 were to conduct only slightly, then the bias across the triodes 15 would increase and the amplifier gain would thereby be increased.

The grid of the control triode 39 is coupled to the point 38 and the cathode of the cathode follower 34 by a resistor 41 and a thyrite wave shaping resistor 42. A second integrating capacitor 43 stores the final bias voltage for control of the triode 39 and thus for the control of the amplifier gain. It may thus be appreciated that the cathode follower 34 and the control triode 39 constitute a first feedback circuit which may have a relatively short time constant such that the output signals from the amplifier 28 will control the gain of at least one stage of amplification which may be considered as a part of the amplifier 28 itself.

A further electron tube 45 contains two triode elements 46 and 47 both of which are connected as cathode followers. The grid of the triode 46 is connected between a pair of voltage dividing resistors 48 and 49 which in turn are coupled between a negative reference potential −E and the output connection 32 of the multivibrator 30. Thus, negative going pulses of the signal are impressed on the grid of the cathode follower 46. A resistor 50 constitutes a load resistance coupling the cathode of the cathode follower 46 to a negative reference potential. A cathode of the triode 46 is further coupled to a condenser 51 through a diode 52 having a relatively low back resistance. If a low back resistance diode is not obtainable, a resistor 53 may be connected in parallel with the diode 52 to thereby decrease the effective resistance of the combined circuits when the diode is non-conducting. During the periods when signals are present, a train of negative pulses from the terminal 32 will be amplified by the cathode follower and will thence be passed by the diode 52 to be stored by the integrating condenser 51. During intervals when signals are present, a second diode 54 is likewise in a state of conduction providing a discharge path for condenser 59.

The triode 47 is connected as the cathode follower but with the grid thereof coupled to the AGC voltage by a resistor 55. The cathode of the triode 47 is coupled to the cathode follower 34 of the AGC circuit by the cathode resistances 56 and 57 and by the diode 58. The AGC voltage determines the conduction of the cathode follower 47 which causes a condenser 59 to be charged by an amount corresponding to the AGC voltage. When an amplifier signal is present, the diode 54 conducts and a negative charge from the condenser 51 passes through the diode 54 and through a resistor 60 to cause a substantial negative potential at a point 61 to cut off the diode 58.

During this condition with the signal being passed, the diode 58 remains cut-off or non-conductive, and the operation of the triode 34 and the AGC circuit generally remain unaffected. However, during the intervals when no signal is received, the condenser 51 loses its charge through the resistor 53, whereupon the diode 54 cuts off and the potential of point 61 becomes positive because the resistor 57 couples the charged condenser 59 thereto. During this condition of no signal, both diodes 52 and 54 become non-conductive or cut-off and the condenser 59 in combination with the diode 58 will maintain the potential at the point 38 at a level determined by the AGC signal level just prior to the interruption of amplified signals. The AGC circuit then becomes clamped with a long time constant which is established by the value of capacitance of the condenser 59. The time constant for charging the condenser 59 with the diode 54 in a state of conduction is relatively short while the time constant for discharging this condenser when the diode 54 is non-conductive is long. The long time constant is useful in clamping the AGC circuit for intervals up to several seconds during which time there may be no signal passing through the amplifier. However, when a signal reappears, the diode 52 becomes again conductive and in a brief interval the condenser 51 regains its charge. This condition results in the unclamping of the AGC circuit. The AGC circuit including the tube 33 constitutes a feedback loop having a relatively short time constant for rapid response to signal variations. The clamp circuit constitutes another feedback loop but having a relatively long time constant for maintaining the amplifier constant, and it includes the tube 45 and the diodes 52, 54 and 58. The two feedback circuits are alternatively operative. During intervals when signals are being passed through the amplifier, the short time constant feedback circuit is operative, and during intervals of no signal, the long time constant feedback circuit is operative.

While the invention has been particularly shown and described with reference to a preferred embodiment thereof, it will be understood by those skilled in the art that various changes in the form and details may be made therein within departing from the spirit and scope of the invention.

What is claimed is:

1. Apparatus for controlling the gain of an amplifier to maintain output signals therefrom at a constant level, comprising: an automatic gain control circuit having an output signal for adjusting the gain of the amplifier associated therewith, first and second inputs to said AGC circuit, means connecting said first input to be energized by the amplifier output whereby the gain of the amplifier is controlled by said AGC circuit to maintain output signals from said amplifier at a constant level, means connected to said AGC circuit and said amplifier output for storing the value of said AGC output signal in response to the absence of output signals from said amplifier and means for switching said stored signal value to said second AGC input in response to the absence of said output signals from said amplifier whereby the gain of said amplifier is controlled in response to said stored value through said AGC circuit.

2. The device of claim 1 wherein the means for switching said stored value to said second AGC input includes a diode connecting the means for storing to said second input, and means for reverse biasing said diode in response to said output signals from said amplifier.

3. A device according to claim 1 wherein the means for storing comprises first and second cathode followers having a common load, means connecting said first cathode follower to be responsive to the AGC voltage, capacitor means for storing a portion of the output of said first cathode follower, means connecting said second cathode follower to be responsive to said amplifier output signals and, diode means connected between said first cathode follower and said load, said diode means being reverse biased by the changed potential across said load resulting from an absence of the output signal and the discharge path of said capacitor is blocked thereby.

4. A device according to claim 3 wherein the means for switching said stored value to said second AGC input comprises a diode connecting the means for storing to said second input and means for reverse biasing said diode in response to output signals from said amplifier.

5. Apparatus for controlling the gain of an amplifier to maintain output signals therefrom at a constant level comprising, an automatic gain control circuit, apparatus for maintaining the gain of said amplifier constant in the absence of said output signals comprising, first means, including short time constant means, for continuously developing, in the presence of said output signal, a first signal responsive to the output of said AGC circuit, second means, responsive to the absence of said output signal, for changing said short time constant means to effectively store a portion of said first signal, and third means for controlling said AGC circuit by said first means in the absence of said output signals to maintain the output of said AGC circuit at a constant level.

6. In an automatic gain control circuit for maintaining output signals from an amplifier at a constant level, means for controlling the gain of said amplifier in the absence of said output signals comprising, first means, including short time constant means, for continuously developing, in the presence of said output signal, a first signal responsive to the output of said AGC circuit, second means, responsive to the absence of said output signal, for changing said short time constant means to effectively store a portion of said first signal, and means for switching the control of said AGC circuit to said first means in the absence of said output signals.

7. Apparatus for controlling the gain of an amplifier to maintain output signals therefrom at a constant level comprising, an automatic gain control circuit, first means responsive to said output signals for controlling said AGC circuit, means, including short time constant means, for continuously developing, in the presence of said output signal, a first signal responsive to the output of said AGC circuit, means responsive to the absence of an output signal from said controlled amplifier for changing said short time constant means whereby said first signal is maintained at a constant level representative of the last derived, and means responsive to an absence of said output signals for switching the control of said AGC circuit to said second signal.

References Cited in the file of this patent

UNITED STATES PATENTS

| | | |
|---|---|---|
| 2,489,126 | Fay | Nov. 22, 1949 |
| 2,556,070 | De Groot | June 5, 1951 |
| 2,750,451 | Crow | June 12, 1956 |
| 2,799,735 | Breckman | July 16, 1957 |